(12) United States Patent
Xin et al.

(10) Patent No.: US 12,101,910 B1
(45) Date of Patent: Sep. 24, 2024

(54) STABLY SWITCHED NEGATIVE-PRESSURE LIQUID COOLING SYSTEM AND STABLY SWITCHED NEGATIVE-PRESSURE LIQUID COOLING CONTROL METHOD

(71) Applicant: SUZHOU METABRAIN INTELLIGENT TECHNOLOGY CO., LTD., Jiangsu (CN)

(72) Inventors: Zhitao Xin, Jiangsu (CN); Guangzhi Liu, Jiangsu (CN); Xiaowei Zhang, Jiangsu (CN); Shengfu Liu, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/708,570

(22) PCT Filed: Jun. 28, 2022

(86) PCT No.: PCT/CN2022/102083
§ 371 (c)(1),
(2) Date: May 8, 2024

(87) PCT Pub. No.: WO2023/173622
PCT Pub. Date: Sep. 21, 2023

(30) Foreign Application Priority Data

Mar. 18, 2022 (CN) .................... 202210266997.X

(51) Int. Cl.
*H05K 7/20* (2006.01)
(52) U.S. Cl.
CPC ..... *H05K 7/20327* (2013.01); *H05K 7/20254* (2013.01)

(58) Field of Classification Search
CPC .................... H05K 7/20254; H05K 7/20327
See application file for complete search history.

(56) References Cited

U.S. PATENT DOCUMENTS 5,048,599 A * 9/1991 Tustaniwskyj ..... H05K 7/20272
361/698
9,010,141 B2 * 4/2015 Harrington ......... F28D 15/0233
62/169
(Continued)

FOREIGN PATENT DOCUMENTS

CN 103699195 A 4/2014
CN 112040746 A 12/2020
(Continued)

*Primary Examiner* — Gordon A Jones
(74) *Attorney, Agent, or Firm* — IPro, PLLC

(57) ABSTRACT

A smoothly switching negative pressure liquid cooling system is provided in the present application, wherein a gas extraction pipeline of a gas circuit is used to extract gas to form a negative pressure environment, a gas supply pipeline is used to supply the gas to form a positive pressure environment. One of the three gas-liquid chambers is used for feeding the liquid and one of the three gas-liquid chambers is used for discharging the liquid to form a coolant circulation. The other chamber maintains a negative pressure environment. At the moment of switching a working state, the chamber that maintains the negative pressure environment forms a large pressure difference, so that the coolant enters the chamber quickly. Before the working state is switched, enough negative pressure has been formed to ensure the fluidity of the coolant at the moment of switching the working state.

20 Claims, 6 Drawing Sheets

(56) References Cited

U.S. PATENT DOCUMENTS

| | | | |
|---|---|---|---|
| 9,712,035 B1* | 7/2017 | Bango | F04B 37/14 |
| 2016/0379852 A1* | 12/2016 | Tustaniwskyj | H01L 21/67109 |
| | | | 165/296 |
| 2020/0205315 A1 | 6/2020 | Ding | |
| 2021/0069745 A1* | 3/2021 | Lerner | B05B 12/14 |
| 2022/0387907 A1* | 12/2022 | Tilz | B01D 24/105 |
| 2024/0198252 A1* | 6/2024 | Oseen-Senda | B01D 53/002 |

FOREIGN PATENT DOCUMENTS

| | | |
|---|---|---|
| CN | 114051356 A | 2/2022 |
| CN | 114286585 A | 4/2022 |
| CN | 114364238 A | 4/2022 |
| JP | 2015185708 A | 10/2015 |

* cited by examiner

STABLY SWITCHED NEGATIVE-PRESSURE LIQUID COOLING SYSTEM AND STABLY SWITCHED NEGATIVE-PRESSURE LIQUID COOLING CONTROL METHOD

CROSS-REFERENCE TO RELATED APPLICATION

The present disclosure claims the priority of the Chinese patent application filed on Mar. 18, 2022 before the China National Intellectual Property Administration with the application number of 202210266997.X and the title of "STABLY SWITCHED NEGATIVE-PRESSURE LIQUID COOLING SYSTEM AND STABLY SWITCHED NEGATIVE-PRESSURE LIQUID COOLING CONTROL METHOD", which is incorporated herein in its entirety by reference.

FIELD

The present disclosure relates to the technical field of cooling and heat dissipation and, more particularly, to a smoothly switching negative pressure liquid cooling system. In addition, the present disclosure further relates to a smoothly switching negative pressure liquid cooling control method.

BACKGROUND

With the continuous improvement of chip power, the traditional air cooling method has been difficult to meet heat dissipation of high-power chips. At present, the highest power of the server chip is more than 500 W, especially in a case of a plurality of high-power chips in the system, a method of the heat dissipation of liquid cooling is almost the only choice. The internal pressure of the traditional liquid cooling system is a positive pressure, that is, the internal fluid pressure of the liquid cooling system is greater than the atmospheric pressure, but the positive pressure liquid cooling faces the problem of pipeline aging rupture or leakage after the cold plate is corroded, the coolant may flow into the liquid cooling system, electronic components are damaged, and serious safety accidents are caused. Compared with a positive pressure liquid cooling system, the internal fluid pressure of the negative pressure liquid cooling system is lower than the atmospheric pressure, so it is called the negative pressure liquid cooling system, in which the liquid may not flow out of the system.

At present, the methods used by the negative pressure liquid cooling system include single-chamber liquid cooling system, double-chamber liquid cooling system, double-chamber switching liquid cooling system and double-chamber+liquid-storing tank liquid cooling system. The single-chamber liquid cooling system relies on pumping the negative pressure in a chamber, while the water pump extracts water from the negative pressure chamber to maintain the negative pressure environment of the system; the double-chamber liquid cooling system maintains the negative pressure in one chamber, and the water pump extracts the water and enters another high-pressure chamber at a same time. Under the pressure of the high-pressure chamber, the water enters the cold plate for heat exchange. The double-chamber switching liquid cooling system uses a low-pressure chamber and a high-pressure chamber to circularly switch to realize the operation of the negative pressure system. The double-chamber+liquid-storing tank liquid cooling system uses a high pressure chamber and a low pressure chamber to circularly switch, and increases a liquid-storing tank to stabilize the flow of the system, at the same time, to realize the operation of the negative pressure liquid cooling system.

SUMMARY

According to a first aspect, a smoothly switching negative pressure liquid cooling system is provided by the present disclosure, which includes: a gas circuit, a liquid circuit and gas-liquid chambers; wherein the gas circuit includes a gas extraction pipeline and a gas supply pipeline, the gas extraction pipeline extracts gas by using a vacuum pump, and the gas supply pipeline supplies the gas by using the vacuum pump; the liquid circuit includes a liquid inlet pipeline and a liquid outlet pipeline; and the gas-liquid chambers includes a first chamber, a second chamber and a third chamber;

a top of the first chamber, a top of the second chamber and a top of the third chamber are connected to the gas extraction pipeline through a gas extraction branch pipe and are connected to the gas supply pipeline through a gas supply branch pipe, respectively; the gas extraction branch pipe and the gas supply branch pipe are independently provided with control valves, respectively;

a bottom of the first chamber, a bottom of the second chamber and a bottom of the third chamber are connected to the liquid inlet pipeline through a liquid inlet branch pipe and are connected to the liquid outlet pipeline through a liquid outlet branch pipe, respectively; the liquid inlet branch pipe and the liquid outlet branch pipe are independently provided with the control valves, respectively; and there are a liquid inlet chamber, a liquid outlet chamber and a negative pressure chamber in three chambers of the first chamber, the second chamber and the third chamber.

In some embodiments, a pipeline connected between the liquid inlet pipeline and the liquid outlet pipeline is provided with a cold plate for heat absorption and a radiator for heat dissipation.

In some embodiments, the gas extraction branch pipe and the gas supply branch pipe are provided with gas solenoid valves, respectively; and the liquid inlet branch pipe and the liquid outlet branch pipe are provided with liquid solenoid valves, respectively.

In some embodiments, a liquid level sensor and a pressure sensor are disposed in each chamber of the gas-liquid chambers.

In some embodiments, an outlet end of the vacuum pump is connected to a pressure relief pipeline, and the pressure relief pipeline is provided with a gas-liquid separator.

In some embodiments, a pipeline connected between the liquid inlet pipeline and the liquid outlet pipeline is provided with a bubble sensor.

According to a second aspect, a smoothly switching negative pressure liquid cooling control method applied to the smoothly switching negative pressure liquid cooling system is further provided by the present application according to any one of embodiments stated above and includes:

in a first state, the second chamber is at a high point of a liquid level, and the first chamber and the third chamber are at a low point of the liquid level; the control valves disposed on the gas extraction branch pipe, the gas supply branch pipe, the liquid inlet branch pipe and the liquid outlet branch pipe are adjusted, and the vacuum pump is used to extract the gas from the first chamber and the third chamber to make the first chamber and the third chamber maintain a negative pressure environment; the vacuum pump is used to supply the gas for the second chamber to make the second chamber maintain a positive pressure environment; a coolant flows into the third chamber, and the first chamber is closed to maintain the negative pressure environment;

in response to the third chamber reaching the high point of the liquid level, a second state is switched, the control valves are adjusted, the gas is supplied for the third chamber to make the third chamber maintain the positive pressure environment, the gas is extracted from the first chamber and the second chamber to make the first chamber and the second chamber maintain the negative pressure environment, and the coolant flows into the first chamber;

in response to the first chamber reaching the high point of the liquid level, the third state is switched, and the control valves are adjusted, the gas is supplied for the first chamber to make the first chamber maintain the positive pressure environment, the gas is extracted from the second chamber and the third chamber to make the second chamber and the third chamber maintain the negative pressure environment, and the coolant flows into the second chamber;

wherein the coolant circularly flows in the first chamber, the second chamber and the third chamber.

In some embodiments, according to detecting signals of liquid level sensors respectively disposed in the first chamber, the second chamber and the third chamber, a controller switches different states.

In some embodiments, a controller acquires a detecting signal of a bubble sensor, and stops to alarm in response to there being continuous bubbles detected in the smoothly switching negative pressure liquid cooling system.

In some embodiments, in a liquid discharge mode, each gas extraction branch pipe is opened, and the first chamber, the second chamber and the third chamber inhale the coolant, at a same time, to make the coolant in the liquid inlet pipeline and the liquid outlet pipeline empty.

Details of one or more embodiments of the present application are proposed in the drawings and descriptions below. Other features and advantages of present application will become obvious from the specification, the drawings and the claims.

BRIEF DESCRIPTION OF THE DRAWINGS

In order to explain the embodiments of the present disclosure or the technical solutions in the prior art more clearly, the drawings needed to be used in the description of the embodiments or the prior art will be briefly introduced, and it is obvious that the drawings in the description below are merely some embodiments of the present disclosure, and a person skilled in the art may obtain other drawings according to these drawings without involving any inventive effort.

Figure 1:
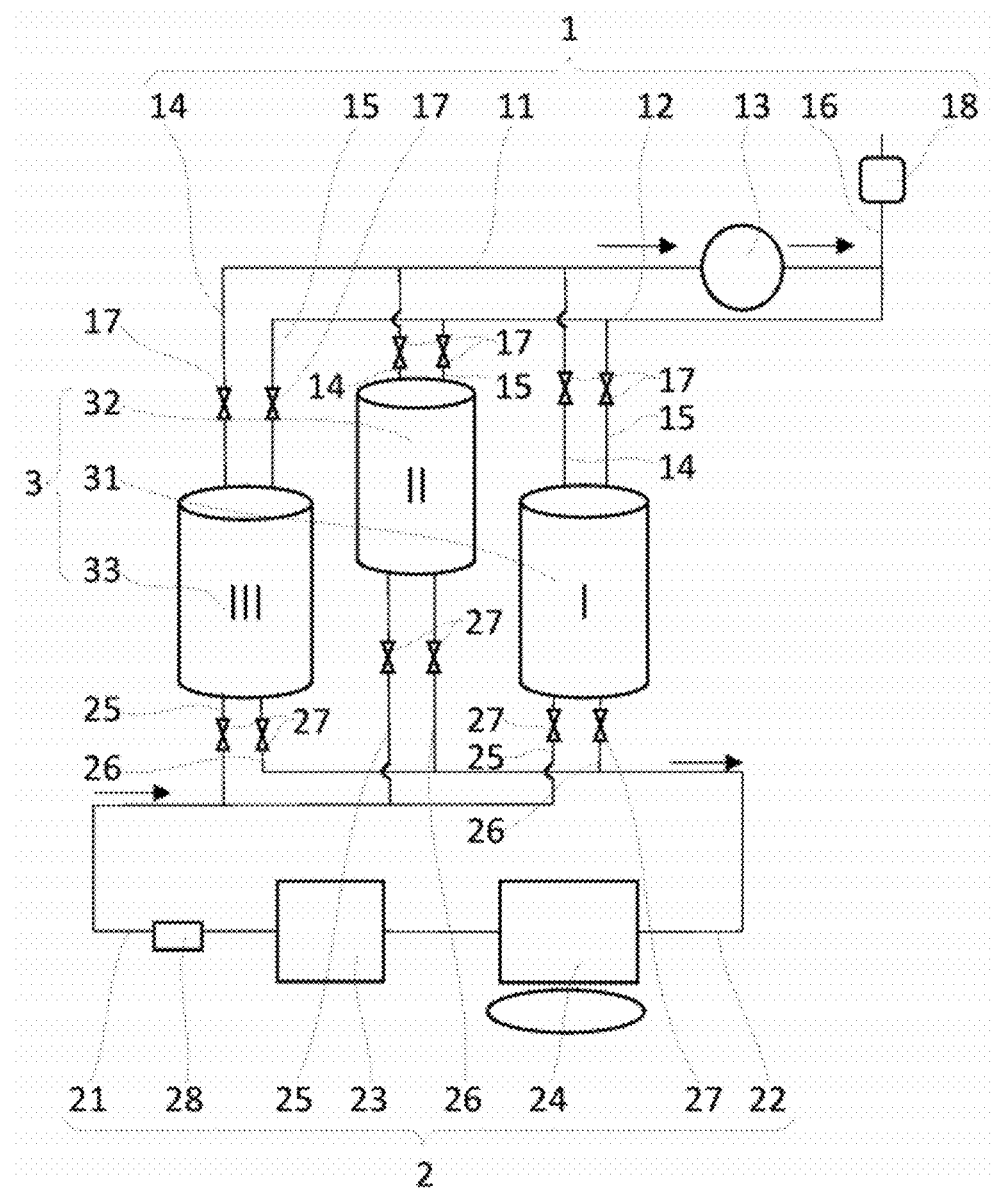
FIG. 1 is a schematic diagram of a structure of a smoothly switching negative pressure liquid cooling system of the present application.

ELEMENTS IN THE DRAWINGS INCLUDE gas circuit 1, gas extraction pipeline 11, gas supply pipeline 12, vacuum pump 13, gas extraction branch pipe 14, gas supply branch pipe 15, pressure relief pipeline 16, gas solenoid valve 17, gas-liquid separator 18, liquid circuit 2, liquid inlet pipeline 21, liquid outlet pipeline 22, cold plate 23, radiator 24, liquid inlet branch pipe 25, liquid outlet branch pipe 26, liquid solenoid valve 27, bubble sensor 28, gas-liquid chamber 3, first chamber 31, second chamber 32, third chamber 33, liquid level sensor 34 and pressure sensor 35.

DETAILED DESCRIPTION

In an existing negative pressure liquid cooling system, since it needs to take a certain time to establish the negative pressure during the switching process of different chambers, a case where the flow rate is unstable may occur, the overall cooling effect of the system is affected. For a person skilled in the art, how to maintain the stability of the coolant flow of the negative pressure liquid cooling system is a technical problem that needs to be solved at present.

The core of the present application is to provide a smoothly switching negative pressure liquid cooling system with at least three chambers, one of which maintains a negative pressure environment at the moment of switching. Comparing with the traditional solution of slowly establishing the negative pressure, the stability of coolant flow is effectively maintained.

In order to make a person skilled in the art better understand the technical solution of the present application, the smoothly switching negative pressure liquid cooling system and the smoothly switching negative pressure liquid cooling control method of the present application will be introduced in detail in combination with the drawings and the embodiments.

FIG. 1 is a schematic diagram of a structure of a smoothly switching negative pressure liquid cooling system of the present application. The smoothly switching negative pressure liquid cooling system includes a gas circuit 1, a liquid circuit 2 and gas-liquid chambers 3 and so on. The gas circuit 1 is used for circulating gas. The gas circuit 1 includes a gas extraction pipeline 11, a gas supply pipeline 12, the gas extraction pipeline 11 and the gas supply pipeline 12 are used as the main pipeline. The gas extraction pipeline 11 extracts the gas by using the vacuum pump 13, and the gas in the gas-liquid chambers 3 is discharged through the gas extraction pipeline 11; the gas supply pipeline 12 supplies the gas by using the vacuum pump 13, and the gas supply pipeline 12 supplies the gas for the gas-liquid chambers 3. The gas extraction pipeline 11 and the gas supply pipeline 12 may be connected to each other and share one vacuum pump 13. The gas extraction pipeline 11 and the gas supply pipeline 12 may also be disposed independently, and are provided with one vacuum pump, respectively.

The liquid circuit 2 is used to circulate a coolant, the liquid circuit 2 includes a liquid inlet pipeline 21 and a liquid outlet pipeline 22. The liquid inlet pipeline 21 and the liquid outlet pipeline 22 are a main pipeline for liquid circulation.

The gas-liquid chambers 3 include a first chamber 31, a second chamber 32 and a third chamber 33. The gas-liquid chambers 3 of the present application include at least three independent chambers, each of the chambers is hollow and may accommodate the gas and the liquid.

A top of the first chamber 31, a top of the second chamber 32 and a top of the third chamber 33 are connected to a gas extraction pipeline 11 through a gas extraction branch pipe 14 and are connected to a gas supply pipeline 12 through a gas supply branch pipe 15, respectively. The gas extraction branch pipe 14 and the gas supply branch pipe 15 are independently provided with control valves, respectively.

Figure 2:
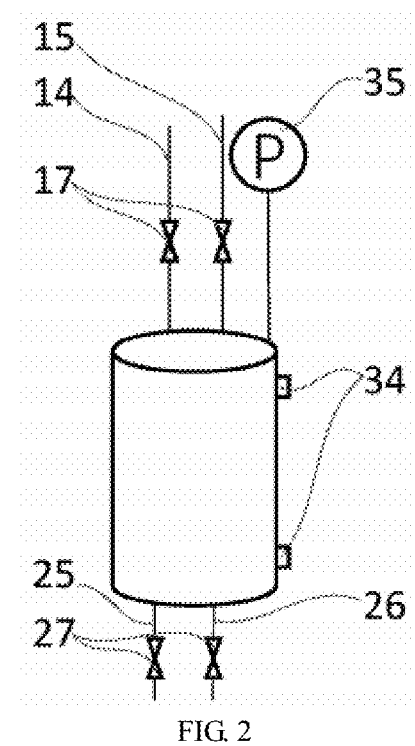
FIG. 2 is a schematic diagram of a structure of a chamber.

The connections of various chambers of the gas-liquid chambers 3 are the same, and FIG. 2 is a schematic diagram of a structure of a chamber. A bottom of the first chamber 31, a bottom of the second chamber 32 and a bottom of the third chamber 33 are connected to the liquid inlet pipeline 21 through a liquid inlet branch pipe 25 and are connected to the liquid outlet pipeline 22 through a liquid outlet branch pipe 26, respectively. The gas extraction pipeline 11 extracts the gas in the gas-liquid chambers 3 to make the gas-liquid chambers form a negative pressure environment. The gas supply pipeline 12 supplies the gas for the gas-liquid chambers 3 to make the gas-liquid chambers 3 maintain a positive pressure environment. The liquid inlet branch pipe 25 and the liquid outlet branch pipe 26 are independently provided with control valves, respectively, which may control the circulating state of the gas and the liquid.

When working, there is a liquid inlet chamber, a liquid outlet chamber and a negative pressure chamber in the three chambers of the first chamber 31, the second chamber 32 and the third chamber 33. That is to say, in a working state, in the chambers, there are at least one chamber feeding the liquid, one chamber discharging the liquid and one chamber maintaining a negative pressure environment; when the state is switched, the chamber that maintains the negative pressure environment inhales the coolant. Under different conditions, the working conditions of the three chambers are alternately cycled.

In the system of the present application, at least three chambers need to be disposed. There are more than three chambers. Each chamber needs to maintain one of the three states. At the same time, there are simultaneously three different states of the chambers. Therefore, there may be more than two chambers with the same state.

In the chambers, at least one is used for feeding the liquid and one is used for discharging the liquid to form a coolant circulation; the circulation power of the coolant comes from the mutual cooperation of the gas extraction branch pipe 14 and the gas supply branch pipe 15 corresponding to each chamber. The liquid is fed in the negative pressure chamber formed by extracting the gas, and the liquid is discharged from the positive pressure chamber formed by supplying the gas, so as to drive the liquid flow.

In addition, at least one chamber maintains a negative pressure environment. The control valves on the liquid inlet branch pipe 25 and the liquid outlet branch pipe 26 of the chamber remain closed, and the liquid cannot enter and exit, and the gas is continued to be extracted outward by using the gas extraction branch pipe 14 to form a negative pressure environment. At the moment of switching the working state, the chamber that maintains the negative pressure environment forms a large pressure difference, and the control valve of the liquid inlet branch pipe 25 is opened, so that the coolant enters the chamber quickly. Since sufficient negative pressure has been formed before the switching of the working state, the fluidity of the coolant at the moment of switching the working state is ensured, and the coolant is always kept at a high flow rate. Through the alternating cycle between the chambers, different working conditions are changed to realize the switching of different working states. In the traditional switching process, it is necessary to gradually vacuum the suction chamber to form a negative pressure environment, and a system of negative pressure process needs to be established. This process cannot generate enough power to make the coolant flow at the moment of switching state, while the present application may continue to maintain the stability of the coolant flow of the negative pressure liquid cooling system.

On the basis of the above solution, the pipeline connected between the liquid inlet pipeline 21 and the liquid outlet pipeline 22 is provided with a cold plate 23 for heat absorption and a radiator 24 for heat dissipation. The cold plate contacts the heating element. When the coolant passes through the cold plate 23, it absorbs heat to cool the heating element. When the coolant flows through the radiator 24, it dissipates heat outward to reduce the temperature. The radiator 24 is usually located outdoors and is provided with a fan to accelerate the heat to dissipate outward.

The liquid inlet pipeline 21 and the liquid outlet pipeline 22 may be fixedly connected to the pipeline, and may also be connected the pipeline by using a disassemble method. These connection methods should be included in the protection scope of the present application.

As shown in FIG. 1, the gas extraction branch pipe 14 and the gas supply branch pipe 15 are respectively provided with gas solenoid valves 17, respectively; and the liquid inlet branch pipe 25 and the liquid outlet branch pipe 26 are provided with liquid solenoid valves 27, respectively. The gas solenoid valves 17 and the liquid solenoid valves 27 are both electronically controlled valves. The control operation is realized by using the controller, and the different working states may be circularly switched, repeatedly.

The structures of various chambers are the same. A liquid level sensor 34 and a pressure sensor 35 are disposed in each chamber of the gas-liquid chambers 3. The liquid level sensor 34 is used to detect a height of the liquid level inside the chamber, and the pressure sensor 35 is used to detect the gas pressure inside the chamber. The detection signal of the liquid level sensor 34 is used as the basis for switching the working state. When the liquid level sensor 34 detects the liquid level reach a high point of the liquid level or a low point of the liquid level, switching is performed. The pressure sensor 35 is used to detect an air pressure value, so that the air pressure is always kept in a reasonable range.

An outlet end of the vacuum pump 13 is connected to a pressure relief pipeline 16, and the pressure relief pipeline 16 is provided with a gas-liquid separator 18. The excrescent gas inside the pipeline is discharged by using the pressure relief pipeline 16, and the liquid carried by the gas is filtered out when the gas passes through the gas-liquid separator 18.

A pipeline connected between the liquid inlet pipeline 21 and the liquid outlet pipeline 22 is provided with a bubble sensor 28, which is used to detect the bubbles contained in the liquid. When continuous bubbles are detected in the system, it indicates that the pipeline is broken or the seal is not firm. The system needs to be maintained, and the system performs a leak alarm and enters the discharge mode.

Figure 3:
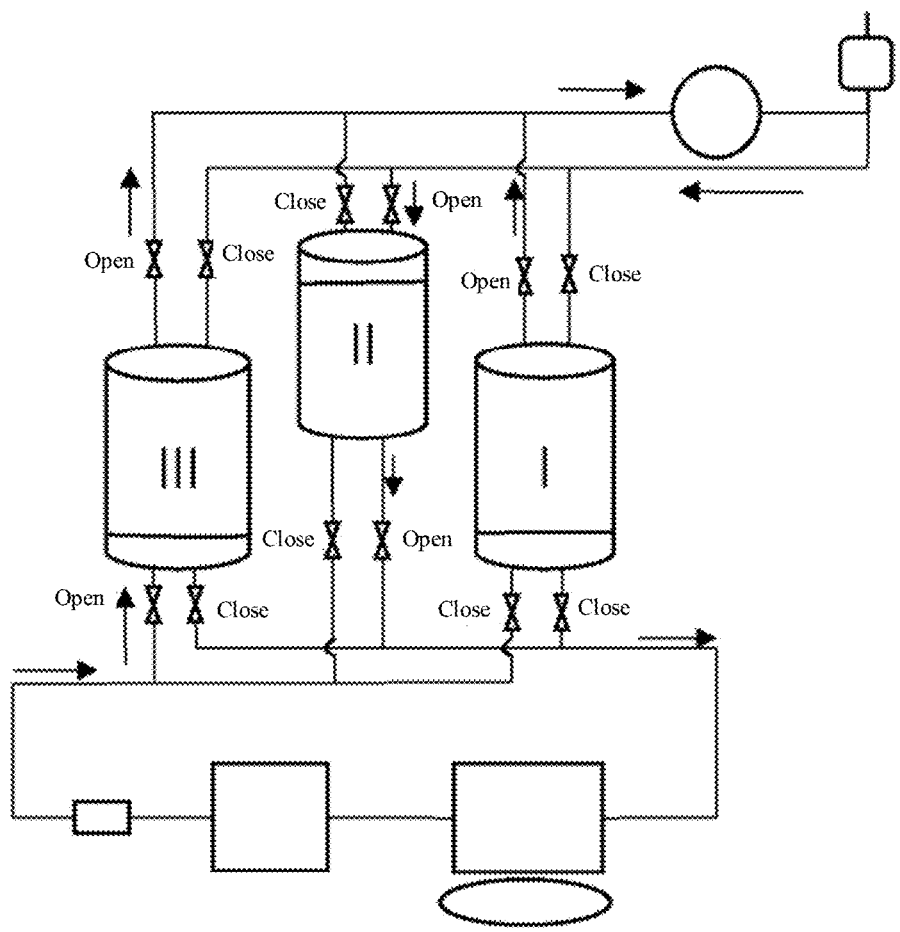
FIG. 3 is a schematic diagram of a first state.

A smoothly switching negative pressure liquid cooling control method applied to the above smoothly switching negative pressure liquid cooling system is also provided by present application, the method includes the following steps:

As shown in FIG. 3, FIG. 3 is a schematic diagram of a first state; the gas is extracted from the third chamber 33 and the liquid is fed in the third chamber 33; the gas is supplied in the second chamber 32, and the liquid is discharged from the second chamber 32; the gas is extracted from the first chamber 31 and the liquid is not fed in and discharged from the first chamber 31.

in a first state, the second chamber 32 is at a high point of a liquid level, and the first chamber 31 and the third chamber 33 are at a low point of the liquid level; the control valves of the gas extraction branch pipe 14, the gas supply branch pipe 15, the liquid inlet branch pipe 25 and the liquid outlet branch pipe 26 are adjusted, and the vacuum pump 13 is used to extract the gas from the first chamber 31 and the third chamber 33 to make the first chamber 31 and the third chamber 33 maintain a negative pressure environment; the vacuum pump 13 is used to supply the gas for the second chamber 32 to make the second chamber 32 maintain a positive pressure environment, thus a liquid is fed; a coolant flows into the third chamber 33, and the first chamber 31 is closed and maintains the negative pressure environment; the liquid flowing of the first state is formed.

Figure 4:
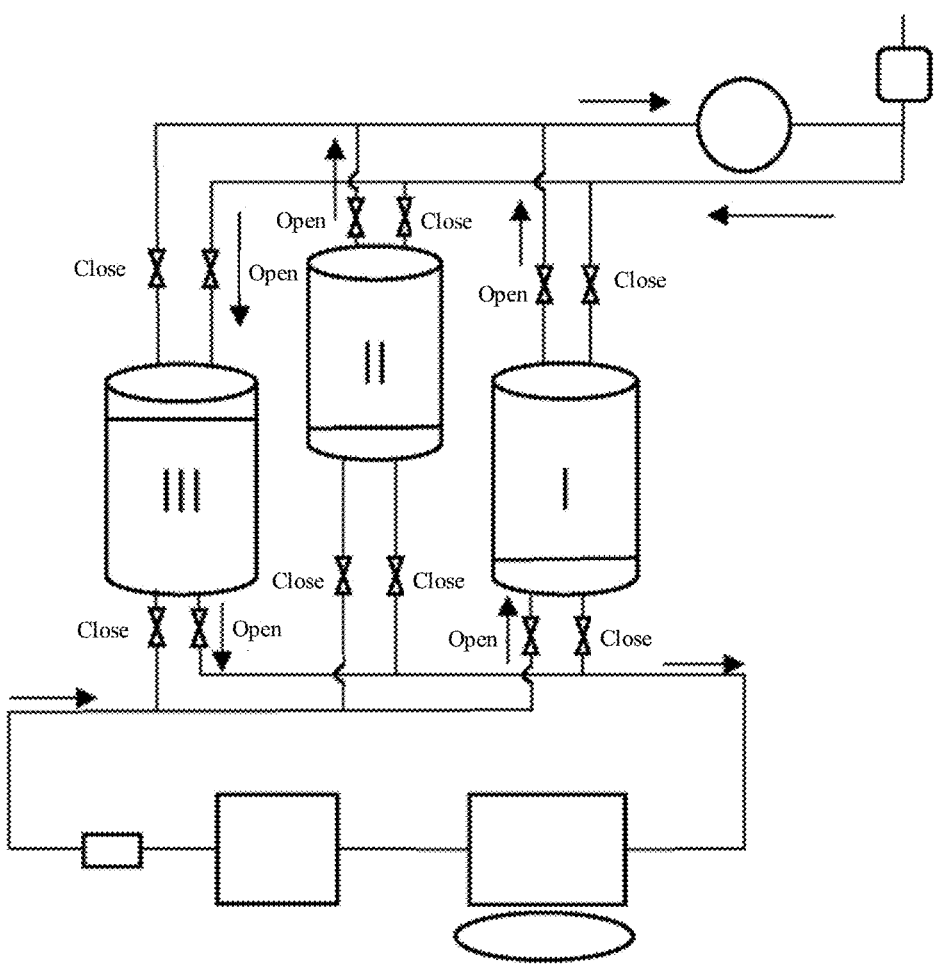
FIG. 4 is a schematic diagram of a second state.

When the third chamber 33 reaches the high point of the liquid level, a second state is switched, FIG. 4 is a schematic diagram of the second state. The gas is supplied for the third chamber 33, and the liquid is discharged from the third chamber 33. The gas is extracted from the second chamber 32 and the liquid is not fed in and discharged from the second chamber 32. The gas is extracted from the first chamber 31 and the liquid is fed in the first chamber 31. The control valves are adjusted, the gas is supplied for the third chamber 33 to make the third chamber 33 maintain the positive pressure environment, the gas is extracted from the first chamber 31 and the second chamber 32 to make the first chamber 31 and the second chamber 32 maintain the negative pressure environment, and the coolant flows into the first chamber 31; the liquid flowing of the second state is formed.

Figure 5:
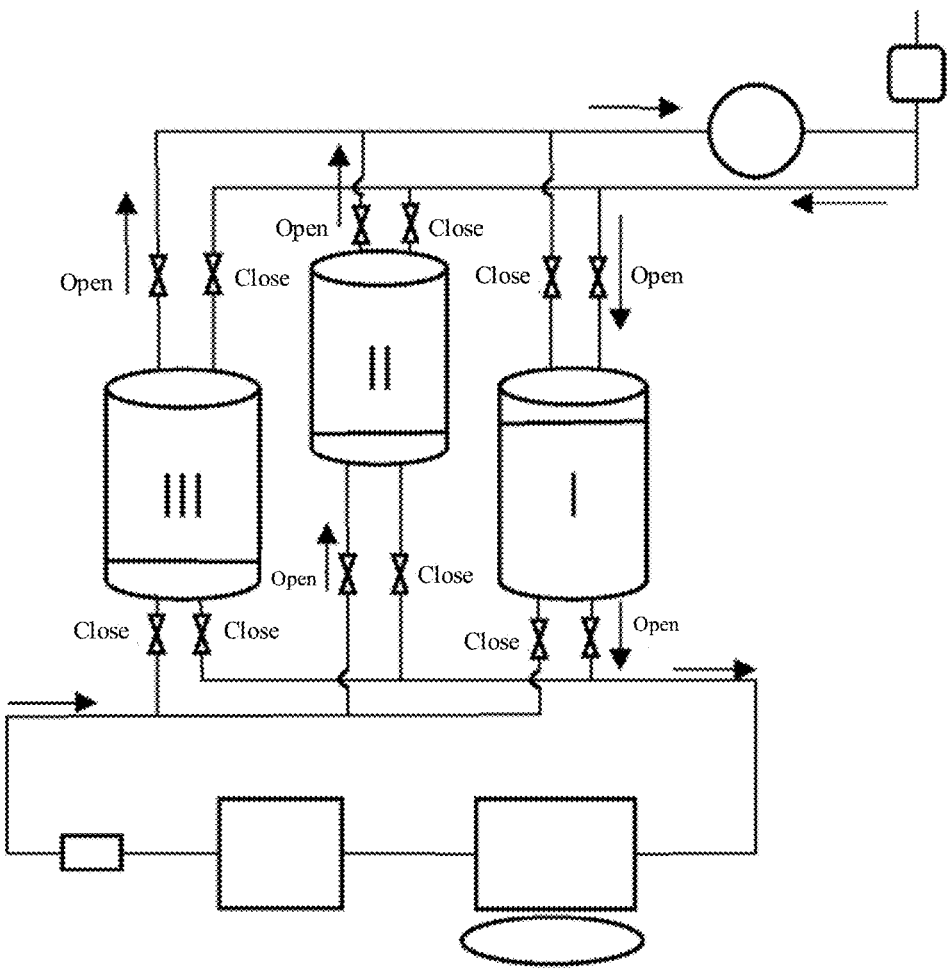
FIG. 5 is a schematic diagram of a third state.

When the first chamber 31 reaches the high point of the liquid level, the third state is switched, FIG. 5 is a schematic diagram of the third state. The gas is extracted from the third chamber 33, and the liquid is not fed in and discharged from the third chamber 33. The gas is extracted from the second chamber 32 and the liquid is fed in the second chamber 32. The gas is supplied for the first chamber 31 and the liquid is discharged from the first chamber 31. The control valves are adjusted, the gas is supplied for the first chamber 31 to make the first chamber 31 maintain the positive pressure environment, the gas is extracted from the second chamber 32 and the third chamber 33 to make the second chamber 32 and the third chamber 33 maintain the negative pressure environment, and the coolant flows into the second chamber 32. After the third state ends, the process of the first state is repeated, and the system circularly and repeatedly operates.

The coolant circularly flows in the first chamber 31, the second chamber 32 and the third chamber 33, and accordingly, the first chamber 31, the second chamber 32 and the third chamber 33 alternately circulate to form a negative pressure environment. The first chamber 31, the second chamber 32 and the third chamber 33 may be an independent chamber, respectively, or may also contain more than two chambers, that is, there are more than two chambers in the same state.

According to detecting signals of liquid level sensors respectively disposed in the first chamber 31, the second chamber 32 and the third chamber 33, a controller switches different states. Combined with the above introduction of the three working states, it may be seen that when the liquid level of a certain chamber rises to the high point of the liquid level, feeding the liquid is stopped and the liquid is reversely discharged. When the liquid level of a certain chamber drops to the low point of the liquid level, discharging the liquid is stopped and a closed negative pressure environment is maintained.

A controller acquires a detecting signal of a bubble sensor 28, and stops to alarm when there are continuous bubbles detected in the smoothly switching negative pressure liquid cooling system. At this time, it indicates that the pipeline is broken or the seal is not firm. The system needs to be maintained, and the system performs a leak alarm and enters a liquid discharge mode.

Figure 6:
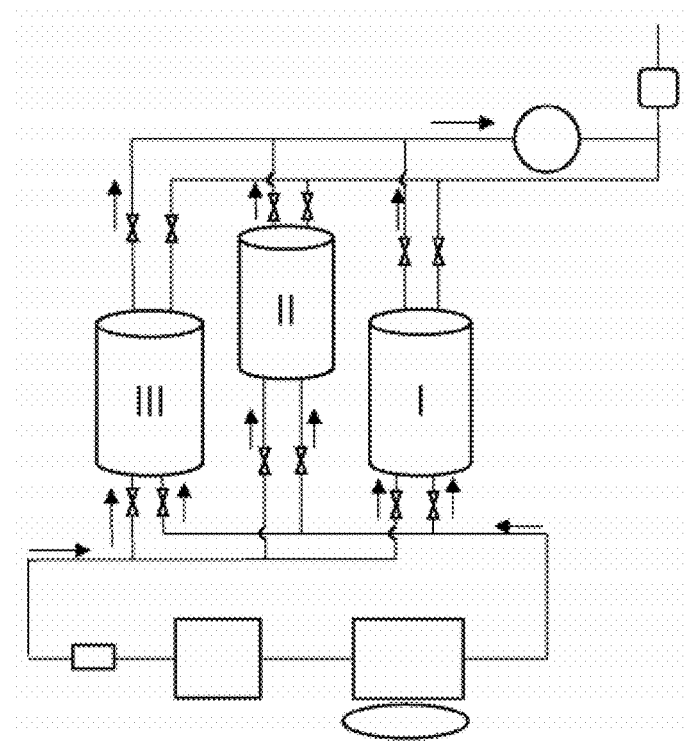
FIG. 6 is a schematic diagram of a smoothly switching negative pressure liquid cooling system when it is in a liquid discharge mode.

FIG. 6 is a schematic diagram of a smoothly switching negative pressure liquid cooling system when it is in a liquid discharge mode. In the liquid discharge mode, the control valves of each gas extraction branch pipe 14 are opened, and the control valves of the gas supply branch pipe 15 remain closed. The first chamber 31, the second chamber 32 and the third chamber 33 inhale the coolant at the same time, so that the coolant in the liquid inlet pipeline 21 and the liquid outlet pipeline 22 is emptied, and all the coolant in the system is discharged into the chamber.

Based on above description of the disclosed embodiments, a person skilled in the art may implement or use the present application. Various modifications to these embodiments will be obvious to a person skilled in the art, and the general principles defined herein may be implemented in other embodiments without departing from the spirit or the scope of the present application. Therefore, the present application will not be limited to these embodiments shown herein, but may conform to the broadest scope consistent with the principles and novel features disclosed herein.

The invention claimed is:

1. A smoothly switching negative pressure liquid cooling system, comprising: a gas circuit, a liquid circuit and gas-liquid chambers; wherein the gas circuit comprises a gas extraction pipeline and a gas supply pipeline, the gas extraction pipeline extracts gas by using a vacuum pump, and the gas supply pipeline supplies the gas by using the vacuum pump; the liquid circuit comprises a liquid inlet pipeline and a liquid outlet pipeline; and the gas-liquid chambers comprises a first chamber, a second chamber and a third chamber;

a top of the first chamber, a top of the second chamber and a top of the third chamber are connected to the gas extraction pipeline through a gas extraction branch pipe and are connected to the gas supply pipeline through a gas supply branch pipe, respectively; the gas extraction branch pipe and the gas supply branch pipe are independently provided with control valves, respectively;

a bottom of the first chamber, a bottom of the second chamber and a bottom of the third chamber are connected to the liquid inlet pipeline through a liquid inlet branch pipe and are connected to the liquid outlet pipeline through a liquid outlet branch pipe, respectively; the liquid inlet branch pipe and the liquid outlet branch pipe are independently provided with the control valves, respectively; and there are a liquid inlet chamber, a liquid outlet chamber and a negative pressure chamber in three chambers of the first chamber, the second chamber and the third chamber.

2. The smoothly switching negative pressure liquid cooling system according to claim 1, wherein a pipeline connected between the liquid inlet pipeline and the liquid outlet pipeline is provided with a cold plate for heat absorption and a radiator for heat dissipation.

3. The smoothly switching negative pressure liquid cooling system according to claim 1, wherein the gas extraction branch pipe and the gas supply branch pipe are provided with gas solenoid valves, respectively; and the liquid inlet branch pipe and the liquid outlet branch pipe are provided with liquid solenoid valves, respectively.

4. The smoothly switching negative pressure liquid cooling system according to claim 1, wherein a liquid level sensor and a pressure sensor are disposed in each chamber of the gas-liquid chambers.

5. The smoothly switching negative pressure liquid cooling system according to claim 1, wherein an outlet end of the vacuum pump is connected to a pressure relief pipeline, and the pressure relief pipeline is provided with a gas-liquid separator.

6. The smoothly switching negative pressure liquid cooling system according to claim 1, wherein a pipeline connected between the liquid inlet pipeline and the liquid outlet pipeline is provided with a bubble sensor.

7. A smoothly switching negative pressure liquid cooling control method, applied to the smoothly switching negative pressure liquid cooling system according to claim 1, comprising:

in a first state, the second chamber is at a high point of a liquid level, and the first chamber and the third chamber are at a low point of the liquid level; the control valves disposed on the gas extraction branch pipe, the gas supply branch pipe, the liquid inlet branch pipe and the liquid outlet branch pipe are adjusted, and the vacuum pump is used to extract the gas from the first chamber and the third chamber to make the first chamber and the third chamber maintain a negative pressure environment; the vacuum pump is used to supply the gas for the second chamber to make the second chamber maintain a positive pressure environment; a coolant flows into the third chamber, and the first chamber is closed and maintains the negative pressure environment;

in response to the third chamber reaching the high point of the liquid level, a second state is switched, the control valves are adjusted, the gas is supplied for the third chamber to make the third chamber maintain the positive pressure environment, the gas is extracted from the first chamber and the second chamber to make the first chamber and the second chamber maintain the negative pressure environment, and the coolant flows into the first chamber;

in response to the first chamber reaching the high point of the liquid level, the third state is switched, and the control valves are adjusted, the gas is supplied for the first chamber to make the first chamber maintain the positive pressure environment, the gas is extracted from the second chamber and the third chamber to make the second chamber and the third chamber maintain the negative pressure environment, and the coolant flows into the second chamber;

wherein the coolant circularly flows in the first chamber, the second chamber and the third chamber.

8. The smoothly switching negative pressure liquid cooling control method according to claim 7, wherein according to detecting signals of liquid level sensors respectively disposed in the first chamber, the second chamber and the third chamber, a controller switches different states.

9. The smoothly switching negative pressure liquid cooling control method according to claim 7, wherein a controller acquires a detecting signal of a bubble sensor, and stops to alarm in response to there being continuous bubbles detected in the smoothly switching negative pressure liquid cooling system.

10. The smoothly switching negative pressure liquid cooling control method according to claim 9, wherein in a liquid discharge mode, each gas extraction branch pipe is opened, and the first chamber, the second chamber and the third chamber inhale the coolant, at a same time, to make the coolant in the liquid inlet pipeline and the liquid outlet pipeline empty.

11. The smoothly switching negative pressure liquid cooling system according to claim 1, wherein the gas extraction pipeline and the gas supply pipeline are connected to each other.

12. The smoothly switching negative pressure liquid cooling system according to claim 1, wherein the gas extraction pipeline and the gas supply pipeline share a same vacuum pump.

13. The smoothly switching negative pressure liquid cooling system according to claim 1, wherein the gas extraction pipeline and the gas supply pipeline are independently disposed.

14. The smoothly switching negative pressure liquid cooling system according to claim 1, wherein the gas extraction pipeline and the gas supply pipeline are provided with one vacuum pump, respectively.

15. The smoothly switching negative pressure liquid cooling system according to claim 1, wherein a structure of the first chamber, a structure of the second chamber and a structure of the third chamber are the same.

16. The smoothly switching negative pressure liquid cooling system according to claim 2, wherein the cold plate contacts a heating element.

17. The smoothly switching negative pressure liquid cooling control method according to claim 7, wherein the gas extraction pipeline and the gas supply pipeline are connected to each other.

18. The smoothly switching negative pressure liquid cooling control method according to claim 7, wherein the gas extraction pipeline and the gas supply pipeline share a same vacuum pump.

19. The smoothly switching negative pressure liquid cooling control method according to claim 7, wherein the gas extraction pipeline and the gas supply pipeline are independently disposed.

20. The smoothly switching negative pressure liquid cooling control method according to claim 7, wherein the gas extraction pipeline and the gas supply pipeline are provided with one vacuum pump, respectively.

* * * * *